(12) United States Patent
Huish et al.

(10) Patent No.: US 8,497,682 B2
(45) Date of Patent: Jul. 30, 2013

(54) ANTENNA FEED

(75) Inventors: David William Huish, Winchester (GB); John Hunt, Southampton (GB)

(73) Assignee: Siemens Aktiengesellschaft, Munich (DE)

( * ) Notice: Subject to any disclaimer, the term of this patent is extended or adjusted under 35 U.S.C. 154(b) by 560 days.

(21) Appl. No.: 12/753,148

(22) Filed: Apr. 2, 2010

(65) Prior Publication Data

US 2010/0253351 A1    Oct. 7, 2010

(30) Foreign Application Priority Data

Apr. 3, 2009  (GB) .................................. 0905769.6
Sep. 8, 2009  (GB) .................................. 0915652.2

(51) Int. Cl.
*G01V 3/00* (2006.01)

(52) U.S. Cl.
USPC ........................................................ 324/318

(58) Field of Classification Search
USPC .................................................. 324/300–322
See application file for complete search history.

(56) References Cited

U.S. PATENT DOCUMENTS

| | | | |
|---|---|---|---|
| 3,611,110 A | 10/1971 | Corbey | |
| 3,824,482 A | 7/1974 | Whelehan, Jr. | |
| 4,620,155 A * | 10/1986 | Edelstein | 324/322 |
| 5,107,217 A * | 4/1992 | Duerr | 324/322 |
| 5,245,288 A | 9/1993 | Leussler | |
| 5,384,536 A | 1/1995 | Murakami et al. | |
| 5,903,198 A * | 5/1999 | Weiss | 333/24.1 |
| 5,949,311 A * | 9/1999 | Weiss et al. | 333/202 |
| 6,326,789 B1 * | 12/2001 | Yoshida et al. | 324/318 |
| 6,677,754 B2 * | 1/2004 | Kestler et al. | 324/322 |
| 6,906,520 B2 | 6/2005 | Heid et al. | |
| 7,088,104 B2 * | 8/2006 | Bottomley | 324/328 |
| 7,123,009 B1 | 10/2006 | Scott | |
| 7,323,876 B2 | 1/2008 | Den Boef | |
| 7,417,433 B2 | 8/2008 | Heid et al. | |
| 7,420,371 B2 * | 9/2008 | Zhang | 324/318 |
| 7,443,163 B2 * | 10/2008 | Warntjes et al. | 324/318 |
| 7,622,928 B2 * | 11/2009 | Gauss et al. | 324/322 |
| 7,701,220 B2 | 4/2010 | Ehnholm | |
| 7,750,630 B2 | 7/2010 | Van Helvoort et al. | |
| 7,750,635 B2 | 7/2010 | Van Helvoort et al. | |
| 7,755,357 B2 * | 7/2010 | Holle et al. | 324/318 |
| 7,777,492 B2 | 8/2010 | Vernickel et al. | |
| 7,936,171 B2 * | 5/2011 | Hu et al. | 324/322 |
| 2003/0206019 A1 | 11/2003 | Boskamp | |
| 2007/0013376 A1 | 1/2007 | Heid et al. | |
| 2007/0188175 A1 | 8/2007 | Burdick, Jr. et al. | |
| 2007/0207763 A1 | 9/2007 | Bollenbeck et al. | |
| 2008/0157769 A1 | 7/2008 | Renz et al. | |
| 2008/0246477 A1 | 10/2008 | Nakabayashi | |
| 2009/0286478 A1 | 11/2009 | Biber et al. | |

FOREIGN PATENT DOCUMENTS

GB    1132545    1/1967

OTHER PUBLICATIONS

U.S. Appl. No. 12/874,706, filed Sep. 2, 2010.
U.S. Appl. No. 12/726,567, filed Mar. 18, 2010.
U.S. Appl. No. 12/753,159, filed Apr. 2, 2010.
U.S. Appl. No. 12/753,132, filed Apr. 2, 2010.

(Continued)

*Primary Examiner* — Dixomara Vargas
(74) *Attorney, Agent, or Firm* — Schiff Hardin LLP (57) ABSTRACT

A microwave antenna feed has a radio frequency trap and a number of microwave transmission lines. The radio frequency trap has co-planar ground and signal layers mounted on one surface of a substrate.

13 Claims, 9 Drawing Sheets

OTHER PUBLICATIONS

U.S. Appl. No. 12/753,150, filed Apr. 2, 2010.
U.S. Appl. No. 12/753,134, filed Apr. 2, 2010.
U.S. Appl. No. 12/753,138, filed Apr. 2, 2010.

"Behavioral Modeling and Simulation of a Parametric Power Amplifier," Gray et al., IMS (2009) pp. 1373-1376.

* cited by examiner

ANTENNA FEED

BACKGROUND OF THE INVENTION

1. Field of the Invention

The present invention relates to a microwave antenna feed, in particular for use in a wireless magnetic resonance imaging (MRI) scanner bore tube assembly.

2. Description of the Prior Art

MRI scanners use a combination of a strong constant magnetic field (B0) from a superconducting magnet which is modified by gradient fields generated by gradient coils, together with a rotating magnetic field (B1) from a radio frequency (RF) antenna to excite nuclear magnetic resonances in the body that generate short term RF signals that are received to build up a tomographic image.

All current-generation MRI scanners employ arrays of local coils mounted in close proximity to the scanned patient to receive the RF with maximum possible signal to noise ratio (SNR). The local coils that receive signals from the back of the patient are mounted in the patient table. Local coils that receive signals from the front of the patient are arranged into 'mats' that are carefully placed over the patient. Associated with each mat is a flexible cable typically containing one co-axial line for each local coil. The cables interact with the B1 field and with the signals generated from the patient so 'traps' (high impedance sections) must be included at regular (typically λ/8) intervals. These add cost and inconvenience to the structure. The solution to this is to provide a wireless system comprising wireless local coils and a microwave antenna array on the scanner bore to receive amplified upconverted signals from the local coils. However, the microwave antenna array needs transmission line feeds which minimize loading of the antenna generating the B1 field.

SUMMARY OF THE INVENTION

In accordance with a first aspect of the present invention, a microwave antenna feed has a radio frequency trap and a number of microwave transmission lines; wherein the radio frequency trap has co-planar ground and signal layers mounted on one surface of a substrate.

The assembly enables a wireless solution without undue loading of the rotating field antenna.

Preferably, the ground layer and signal layer are mounted on one face of the substrate and the microwave transmission lines are mounted in another plane of the substrate.

Preferably, the ground layer and signal layer are positioned adjacent one another on the planar substrate, separated by a distance of greater than 4 mm.

The preferred separation is between 5 and 6 mm and this provides adequate breakdown separation and constant coplanar impedance.

Preferably, the antenna feed further comprises a second substrate.

Preferably, the transmission lines are disposed between the substrate and the second substrate.

Preferably, a number of transmission lines mounted on the substrate are separated by ground rails.

Preferably the antenna feed further comprises a plurality of semi-rigid feed cables mounted on the signal layer.

Preferably, the feed further comprises a tuning section.

Preferably, the feed further comprises capacitive loading.

Preferably, the microwave transmission line comprises microstrip.

Preferably, the microwave transmission line comprises stripline.

In accordance with a second aspect of the present invention, a magnetic resonance imaging scanner assembly has a bore tube, an RF antenna having a number of antenna rungs mounted around the circumference of the bore tube, and a number of microwave antenna elements mounted around the circumference of the bore tube. The antenna rungs and antenna elements are sub-divided into groups around the bore tube; each group being provided with a microwave antenna feed according to the first aspect.

Preferably, the microwave antenna elements are interleaved with the antenna rungs within the groups.

DESCRIPTION OF THE PREFERRED EMBODIMENTS

The wireless concept is based on upconversion of the RF (Larmor) frequency signals to microwave frequencies and transmission from local coils located in the patient mat to microwave antennas located on the bore of the scanner. The combination of transmit and receive antennas on the patient and bore respectively constitutes a MIMO (Multiple Input/ Multiple Output) system. The greater multiplicity of receive antennas in the bore array allows individual signals from the patient antennas to be resolved. Ideally, the wireless solution substantially satisfies the requirements of the existing wired system, maintaining in particular the low noise figure and the dynamic range.

An example of a wireless MRI scanner bore tube assembly which may include an antenna assembly according to the present invention is described in co-pending UK patent application no. 0903729.2, corresponding to U.S. Ser. No. 12/613,004 filed Nov. 5, 2009. The bore tube assembly has an RF antenna, a microwave antenna array and an electrical screen. The RF antenna includes a series of RF antenna elements, each having a rung. The rungs are spaced at intervals of substantially half of the wavelength of the frequency of operation of the microwave antenna array. The microwave antenna array has a series of microwave antenna elements interleaved between the rungs and the screen acts as a reflector to reflect signals from the microwave antenna elements towards the center of the bore tube. Alternatively, the microwave antenna elements may be placed below the body coil rungs, in some cases mounted on the rungs, so that the rungs can be used to reflect signals from the microwave antenna elements toward the center of the bore tube and the elements are mounted on the rungs.

Figure 1:
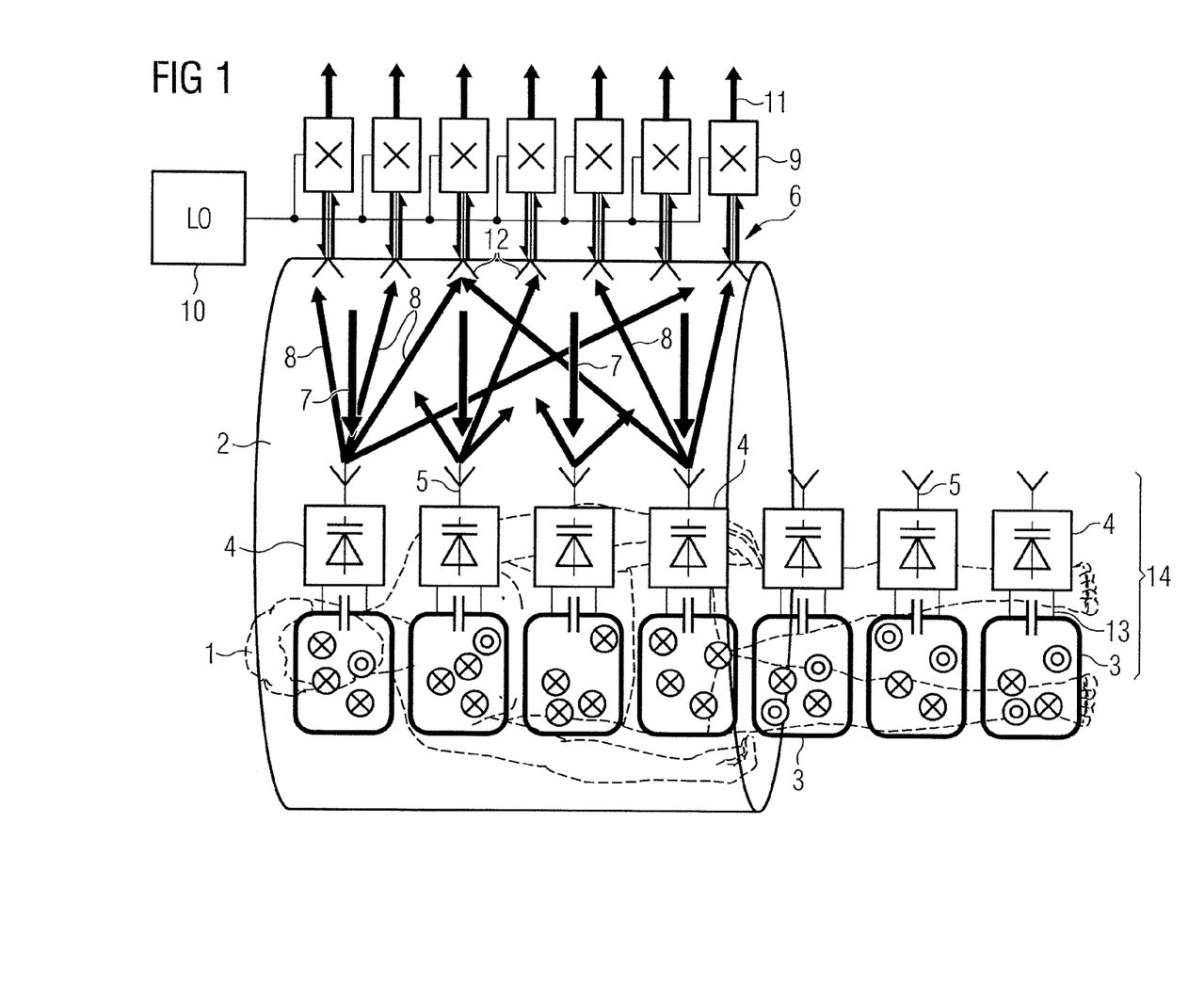
FIG. 1 illustrates a microwave antenna feed for a wireless MRI system incorporating a bore tube assembly in which an antenna assembly according to the present invention may be used.

An example of an MRI system using a MIMO microwave link, suitable for using a bore tube assembly of this type will now be described. However, other architectures are possible. FIG. 1 shows a patient 1 within an MRI scanner bore tube 2. A mat covers those parts of the patient for imaging and embedded in the mat are a plurality of local coils 3. Associated with each local coil 3 is an upconverter 4 and microwave antenna 5. Transceivers 9 connected to an array 6 of antennas 12 are integrated into the scanner bore 2. The frequency upconverter 4 for each patient mat coil 3 produces signals for transmission to the array of transceivers in the scanner bore 2. A signal generator 10 generates a local oscillator (LO) signal at 2.44 GHz, or other chosen microwave frequency, which feeds the transceivers connected to the antenna array 6 to illuminate the patient coil electronics 14 with a signal 7 at the local oscillator frequency. The same LO signal in the transceivers converts the microwave signals 8, received from the patient coils 3 at the LO frequency ±63 MHz, back to the original magnetic resonance (MR) frequency of 63 MHz for input 11 to MR receivers in an image processing system (not shown). The local coil upconverters 4 are based on parametric amplifiers and implement low noise frequency conversion and amplification in simple, low cost circuitry. The parametric amplifiers use the incident local oscillator signal 7 to provide the frequency reference and the power for the upconversion. MR signals 13 from the coils are thereby converted to microwave frequency and transmitted to the bore transceiver antenna array 6. In one embodiment, an arrangement of microwave dipole antennas is fabricated on the same printed circuit board as a magnetic resonance imaging (MRI) birdcage antenna and located between the rungs. The radio frequency (RF) screen, located on the inner surface of the gradient coil acts as a reflector for the microwave antennas In order for the wireless system to operate with minimal or no degradation in received signal to noise ratio the array 6 of microwave antennas 12 around the bore 2 must have element center to element center spacing in both directions, around and along the bore, of the order of half the wavelength of the operational microwave frequency. Patient coil spacing influences the choice of microwave link frequency but in general, any microwave frequency may be chosen providing that it is high enough to provide the spatial resolution and low enough that the number of required bore antenna elements and associated electronics is practical. Operation at 2.44 GHz gives an antenna spacing of about 6 cm.

As described earlier, MRI scanners necessarily incorporate an RF antenna that generates the $B_1$ field at the Larmor frequency, which is dependent upon the $B_0$ field strength, so is 63.6 MHz for a typical 1.5 Tesla $B_0$ magnetic field, or 123 MHz for a 3 T system. These values are commonly used magnet and MR frequencies, but magnets ranging from 0.5 T to 11 T could be used and the MR and local oscillator microwave frequencies may also be chosen from a much wider band. For example, dependent upon the nucleus type, the MR frequencies may range from 20 MHz to 500 MHz and the LO frequency might be chosen in the range of 1 GHz to 5 GHz.

Figure 2:
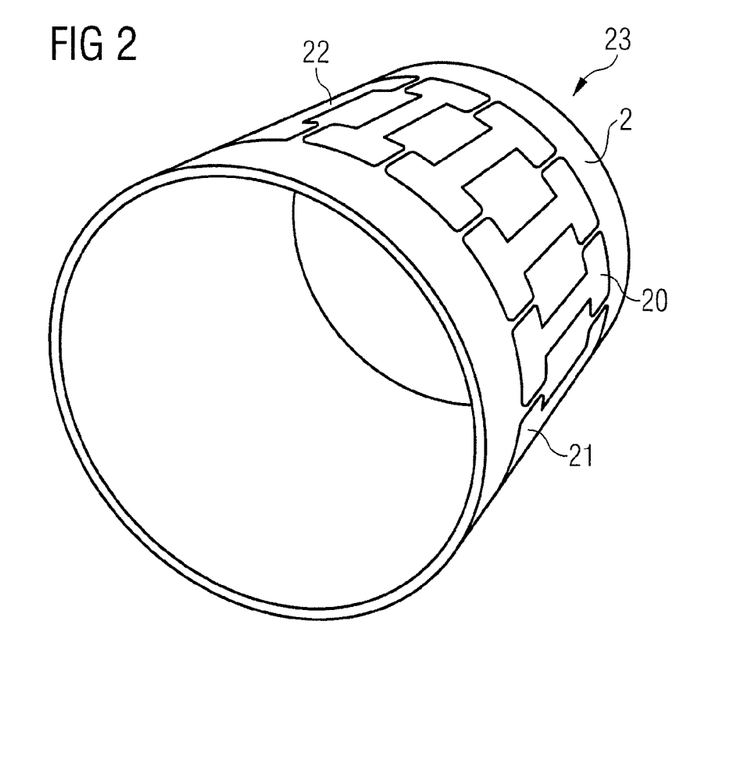
FIG. 2 illustrates a schematic outline of a simplified conventional birdcage type RF antenna.

Commonly the construction of the $B_1$ field antenna 24, also known as a "body coil," takes the form of a "birdcage" with two separated rings 20, 21 printed around the bore 2 and connected by a number of rungs 22 regularly spaced around the bore, as shown in FIG. 2. Each element 23 of the antenna is formed of a rung and a part of each ring. The width and spacing of the rungs around the circumference of the bore are chosen to maintain half wavelength spacing of the microwave elements and provide sufficient current handling capability for the body coil. The minimum gap between end ring segments that form the end rings is determined by the RF voltage present between adjacent segments during the excitation phases of a scan. The length of the rungs and the dimensions of the end ring segments are dependent upon the volume that needs to be imaged and the constraints imposed by specific absorption rate (SAR) limits. Capacitors and diodes (not shown) are incorporated in the design of the body coil at appropriate positions for tuning and switching purposes. A screen 34 is printed on the inside of the gradient coil (not shown) to minimize undesirable egress of $B_1$ field energy outside the bore imaging region. A gap of 1 to 2 cm of air or glass reinforced plastic (GRP) between the screen and the body coil allows a flux return path for the magnetic fields generated by the body coil rung currents.

The arrangement of microwave antennas aims to satisfy a number of requirements. These include high efficiency, i.e. that gain is directed towards the center of the bore; a consistently good impedance match over a useful range of angles of incidence; a negligible effect on $B_1$ field uniformity and strength; practical implementation of feeds to the microwave antennas and the creation of a microwave absorptive surface achieved by the half wavelength spacing of the elements in the array.

Figure 3:
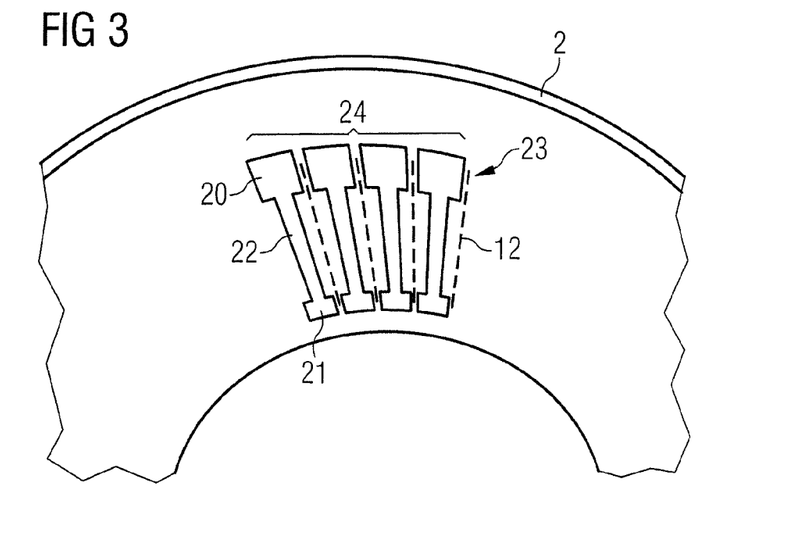
FIG. 3 illustrates an example of the integration of microwave antenna elements into a birdcage RF antenna with the bore tube assembly of FIG. 1.

The number of body coil rungs around the bore is arranged, such that the separation between adjacent rungs is nominally equal to $\lambda/2$ at the LO frequency, which for the example given above means a separation of about 6 cm. Dipole antennas, which may take the form of "standard" dipole antennas, folded dipole antennas, inductively loaded or capacitively loaded dipole antennas, are located in between and coplanar with the rungs and orientated as shown in FIG. 3. In a practical implementation, the birdcage rungs and antenna elements cover the entire circumference of the bore tube 2, but for clarity, only a subset of antenna elements are shown in the figures.

Figure 4A:
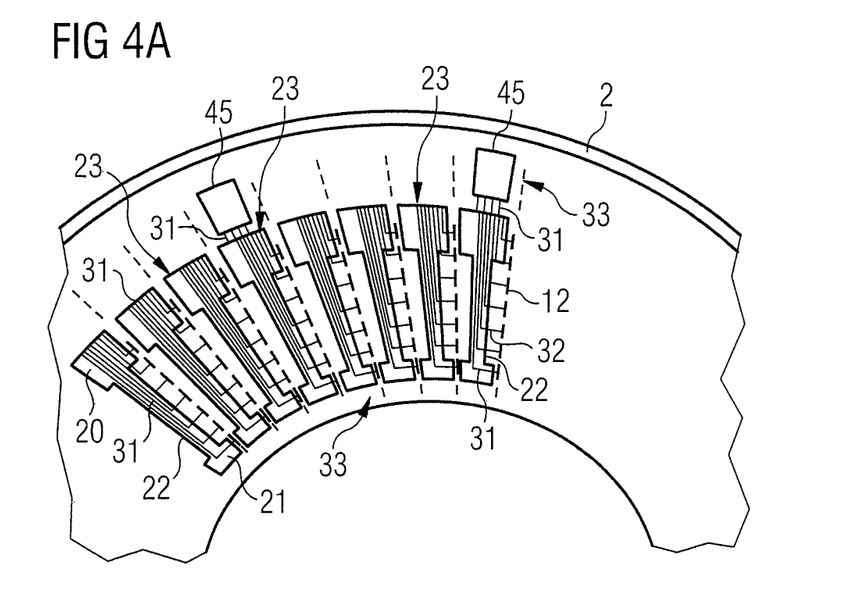
FIG. 4A illustrates an example of how feed lines to the microwave antenna elements are provided and an antenna feed according to the present invention, integrated into the bore tube assembly of FIG. 1.
Figure 4B:
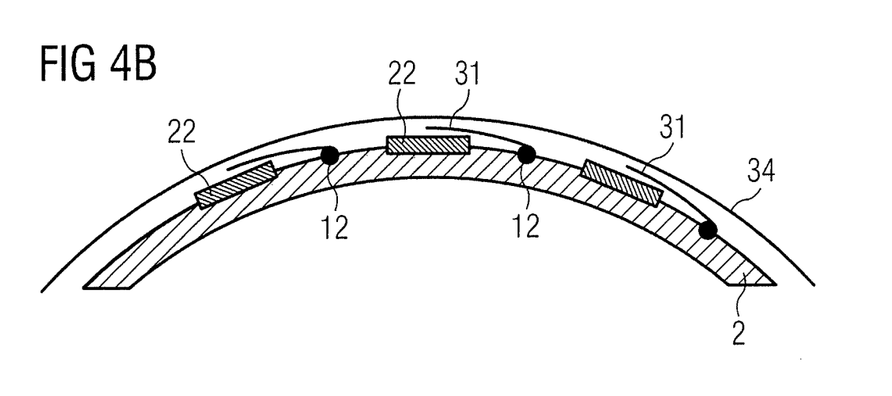
FIG. 4B is a cross-section showing the relative arrangements of the RF antenna elements and microwave antenna elements using a screen as a reflector in the bore tube assembly of FIG. 1.

The bore tube, shown in FIG. 3 comprises a support tube 2, with bird cage antenna elements 23 provided on the support tube and microwave dipole antenna elements 12 in parallel in gaps between the bird cage antenna elements 23. One method of construction of the microwave array 6 is to print both the body coil 24 and microwave dipole array 6 on a thin flexible substrate material 35, which is wrapped around the outside of the mechanically strong support tube 2 having a similar form to support tubes that are currently in use. The printed antenna rungs on the outer surface of the bore tube are spaced at equal intervals around the bore tube. In this example, the antenna elements are mounted between adjacent rungs. FIG. 4A illustrates an example in which an antenna feed 45 according to the present invention, is provided at a first rung 22 within a set of rungs, but not for all rungs. As shown in FIG. 4B, an RF screen 34 is provided outside the rungs 22 and dipoles 12. This screen then also functions as a reflector for the dipole antenna elements, augmenting their gain toward the bore center whilst reducing wasteful radiation of energy away from the bore. The bore tube is constructed with the screen layer 34, typically copper, positioned inside the gradient coils and outside the support tube 2, which is typically a plastic tube. The integration of the microwave antenna in the bore tube is arranged to minimize adverse interaction between the two.

Figure 5A:
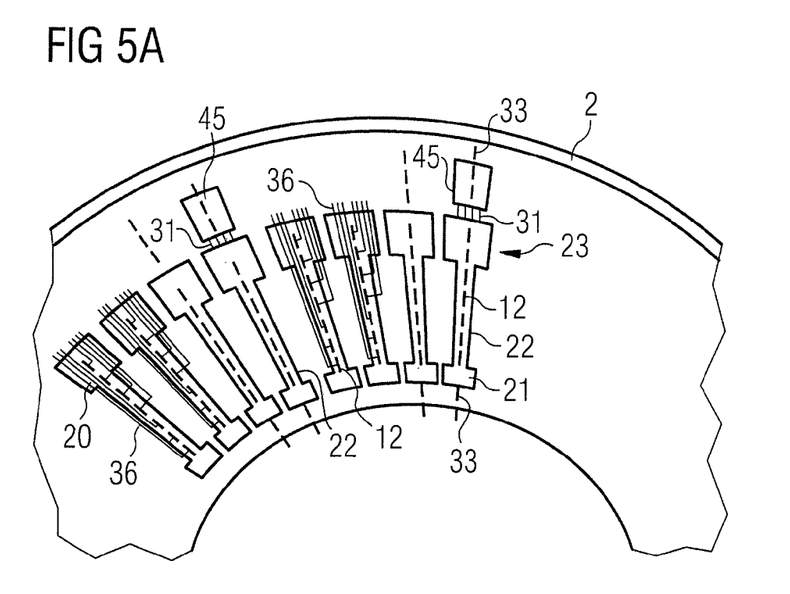
FIG. 5A illustrates another example of how feed lines to the microwave antenna elements using rungs as reflectors are provided and an antenna feed according to the present invention, integrated into the bore tube assembly of FIG. 1.

In such a construction, the antennas may be fed by microstrip or stripline feed lines, where the rungs of the body coil form the ground plane for the feeds. The example shown in FIG. 4A is of microstrip feed lines 31, running along the long axis of the RF antenna elements 23, connected to the microwave antennas 12 using baluns 32. Conventionally, the other end of each of the feedlines associated with a particular rung is connected to suitable filters, or "traps", that are designed to block the transmission of signals at the Larmor frequency, but allow transmission of the microwave signals to and from the bore electronics. However, for the present invention, FIGS. 4A and 5A illustrate examples of how the antenna feed of the present invention is incorporated into the bore assembly. The antenna feed 45 is positioned at one end of a feed rung 22 of the birdcage antenna and the transmission lines 31 pass signals from the antenna feed 45 to the microwave antenna elements 12. In this example, only one in four of the antenna rungs 22 arrayed around the bore tube have a direct connection to the antenna feed. Elements on any other rung receive signals routed via the transmission lines on the feed rung and across to the transmission lines on those elements.

Additional microwave antenna elements 33 may be located beyond the ends of the body coil, but also printed on the same substrate material. These elements will radiate with the same polarization as the dipoles to provide the required microwave coverage for both LO illumination and microwave reception of the upconverted signals. These elements may take the form of dipoles or patch antennas.

The microwave feedline 31 and array structure 6 integrated with the body coil 24 has a number of advantages making it suitable for the wireless application. The RF screen 34 acts as a reflector directing energy towards the center of the bore tube 2. The structure can be fabricated using standard printed circuit board manufacturing methods, so that the structure benefits from thin metallic layers to minimize the introduction of eddy currents caused by the switching of the gradient coils; the structure is mechanically and hence electrically repeatable and so provides a good impedance match at the microwave antenna ports; the structure fits into the existing spatial constraints with no impact on bore diameter; and a single process is used to deposit the body coil 14 and the microwave array 6 on same substrate 35. In an example of using a microstrip feed arrangement, the dipoles 12 and antenna elements 23 may be printed onto one side of a thin pcb, with the feed 31 printed onto the other side with the pcb then wrapped around the outside of the support tube 30. The feed structure of the present invention makes use of the copper rungs in the existing designs, as ground plane and therefore has minimal impact on $B_1$ field uniformity and strength. Low noise amplifiers, or similar electronics, may also be mounted on the thin PCB within the active bore region, also using the body coil rung 22 as the ground plane. The dc power for these components may be fed via trapped dc feedlines or connected to the zero RF potential points on the body coil, or fed via bias tees and the microwave lines.

In an alternative implementation, rather than providing the screen, as in FIGS. 4a and 4b, the rungs 22 of the bird cage antenna elements 23 act as reflectors. One method of construction of the integrated system implements the birdcage antenna and the microwave array on two separate printed flexible printed circuit boards (PCBs.) The flexible bird cage 23 is etched from copper on a flexible PCB which is then wrapped around and bonded to the outside of a mechanically strong support tube 30, typically plastic, having a similar form to support tubes that are currently in use. The microwave dipole array 6 is etched from copper on a 2nd flexible PCB which is then bonded to the inside of the bore tube 2. The two PCBs are designed such that the angular pitch of the strips of microwave radiating elements around the axis of the bore is the same as that of the rungs 22. The two flexible PCBs are installed on the support tube such that the microwave antenna array strips are in angular alignment with the rungs 22 of the birdcage antenna so as to allow the rungs 22 to function as reflectors for the microwave dipole antenna elements, thereby augmenting the gain of the microwave antennas toward the bore center. The bore tube is constructed with the screen layer 34, typically copper, positioned inside the gradient coils and outside the support tube 30. The integration of the microwave antenna in the bore tube is arranged to minimize adverse interaction between the two.

Figure 5B:
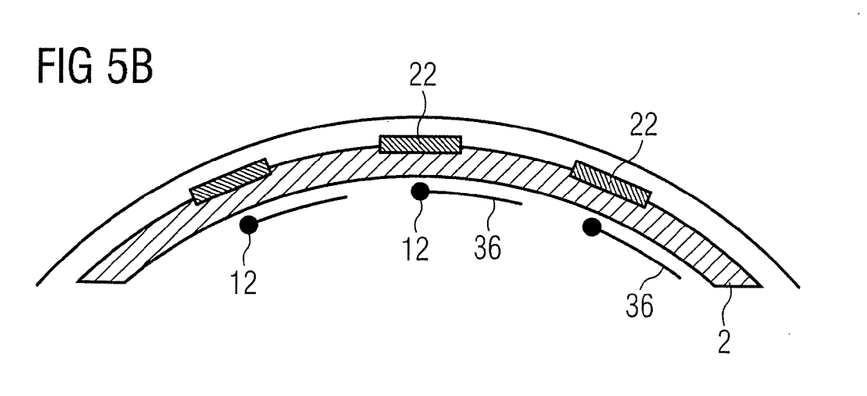
FIG. 5B is a cross-section showing the relative arrangements of the RF antenna elements and microwave antenna elements using rungs as a reflector in the bore tube assembly of FIG. 1.

In such a construction, the antennas may be fed with a differential transmission line structure 36, for example "parallel plate" type lines. There is a differential feed 36 shown in FIGS. 5A and 5B to each dipole end 12. The ends of the transmission lines not connected to antennas are connected to the antenna feed of the present invention, which blocks the transmission of signals at the Larmor frequency, but allows the transmission of the microwave signals to and from the bore electronics. The dielectric constant and thickness of the bore tube 2 provides an electrical separation between the microwave antenna element 12 and body coil rung 22 that allows the rung to act as a reflector, augmenting the gain of the microwave antennas towards the bore center. The structure can be fabricated using standard printed circuit board manufacturing methods. Benefits of this implementation in thin printed copper include minimization of induced eddy currents caused by the switching of the gradient coils and a mechanically, and hence electrically, repeatable structure that provides a good impedance match and low physical space requirement.

Figure 6:
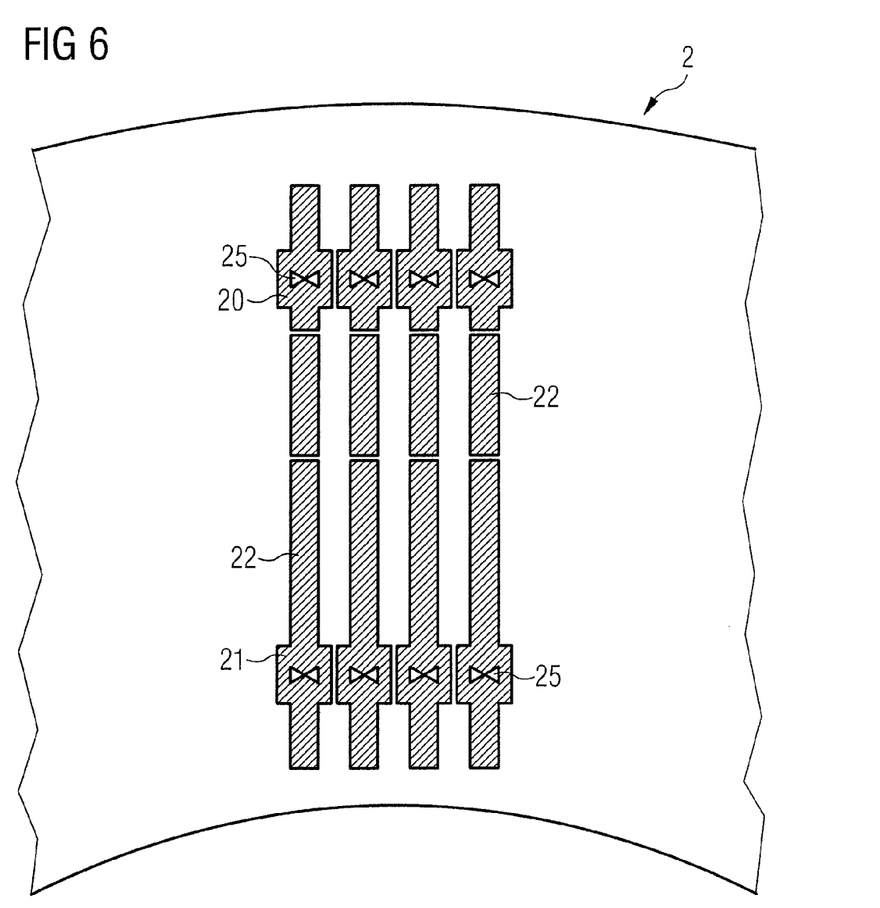
FIG. 6 shows an embodiment of the bore tube assembly of FIG. 1, in which slot antenna elements are provided in end rings.

The structure also lends itself to the introduction of slot antennas 25 in the end rings 20, 21 if space precludes the use of dipoles 12 in this region. This is illustrated in FIG. 6. Such slot antennas are orientated circumferentially to maintain the E-field polarization along the axis of the bore in alignment with the dipoles. Such slot antennas may be aligned parallel with the dominant current flow direction in the end rings 20, 21 and can thereby minimize disruption of the high RF excitation currents. The aggregate antenna structure provides a microwave absorptive surface with the chosen element spacing and feedpoint leading to realizable feedline impedances. Any microwave antennas that do not need to be fed may be terminated with resistive loads to maintain the absorptive properties of the array The printed microwave antennas 12 must be connected by transmission line 31 to the microwave electronics that reside on the edge of the bore tube or outside the bore tube. Such connections must be made in such a way that high isolation is maintained between the RF antenna elements 22 and the microwave electronics 52 at the MR Larmor frequency. This is needed in order to avoid loading the birdcage antenna 24 in such a way that its characteristics are distorted or in such a way that significant transmit RF power is lost at the Larmor frequency. Even if the loading is modest it must be rotationally symmetrical in order to avoid distortion of the $B_1$ field.

Figure 7:
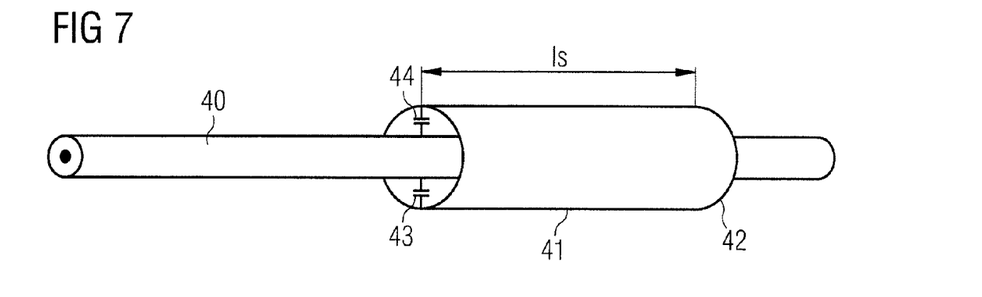
FIG. 7 illustrates a conventional bazooka balun for use in an MRI scanner.

The normal method of minimizing the loading on the birdcage antenna 24 is to use a trap circuit or bazooka balun circuit for feeding any signals to the antenna. An example of a conventional bazooka balun is shown in FIG. 7. A semi-rigid coaxial feed cable 40 is provided within a balun sleeve 41 of length ls having a short circuit 42 and an open circuit 43. The conventional ¼ wavelength line with a short circuit at one end, could be used, when driving the array, to provide a trap to prevent signals at the Larmor frequency of 63 MHz from being returned, the ¼ wavelength at the operational frequency is 1.2 m, so this is not practical for the constrained space of an MRI system. The balun has been electrically shortened by capacitive loading 44 at an open circuit 43 in order to permit length ls to be accommodated within the scanner.

Furthermore, the number of such required traps is at least equal to the number of receivers (transceivers 9). Additional traps will also be required to feed local oscillator power to the transmit-only microwave antennas. In principle, the number of transmit-only traps could be substantially reduced by splitting the microwave signals feeding out to the antennas on the RF-hot end of the traps—i.e. substantially within the birdcage. However, it may be possible to do this only to a limited degree because the total power requirements may be too great to feed a very large number of microwave antennas from a single trap. The overall effect is that the required number of traps is large—a total of the order of 100 or more. This creates two problems:

The space available for the traps may not be adequate or the provision of the required number of traps may erode required space for the microwave electronics.

Every trap contributes a degree of loading at the MR Larmor frequency. Although, individually the loading is modest, when multiplied by the order of 100 traps, the loading become unacceptably high.

In order to get large numbers of microwave signals onto the body coil structure, without such a high number of traps, one option would be to use multiple semi-rigid feeds within a tube. However, it would be necessary to phase match all of the semi-rigid feeds and to use small diameter feeds to fit a sufficient number into the tube. This means it is difficult to manufacture to the required tolerances. Even once manufactured, the construction then needs to go onto the printed circuit board of the bore liner.

The present invention addresses the need to provide transmission line feeds from one or both ends of the bore in a way that minimizes loading for the birdcage antenna at the Larmor frequency and that maintains circumferential symmetry of the loading that does ensue. Instead of the conventional arrangement whereby each track passing from outside the birdcage antenna has a separate trap, the invention provides a multiple feed bazooka arrangement, whereby tracks that pass from outside the birdcage antenna are grouped together such that the tracks that connect either directly or via splitters to antennas that lie between a number of birdcage antenna rungs, all pass initially along just one birdcage rung, the initial feed rung.

By subdividing the necessary microwave connections into smaller groups and arranging for the microwave connections in each group to pass together through a single novel bazooka balun arrangement, the loading on the birdcage antenna is reduced. The reduced number of balun arrangements is arrayed around the MR bore in such a way as to achieve symmetry of placement around the circumference of the bore. The benefits include a significant reduction in the space required for the total number of traps, as well as reduced and uniform loading. The loading on the birdcage antenna is now multiplied only by the number of groups of microwave connections, rather than the number of individual microwave connections. Hence the total loading of the birdcage antenna is greatly reduced. The symmetrical arrangement ensures uniform loading of the birdcage antenna.

Figure 8:
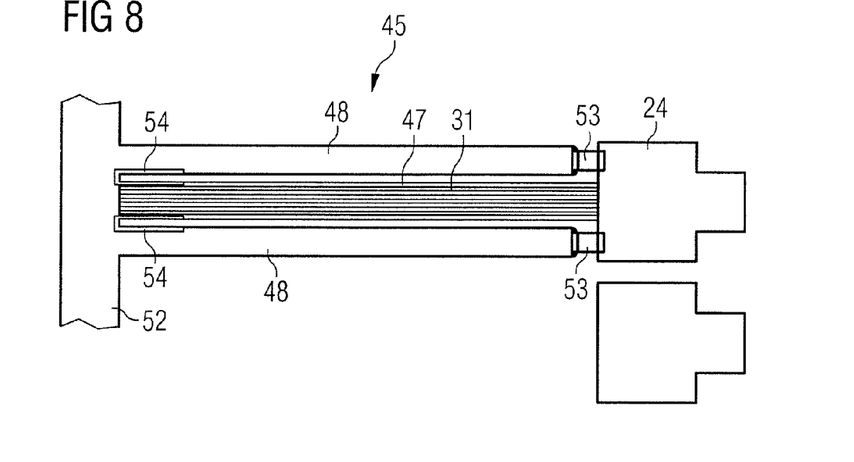
FIG. 8 is a plan view of an antenna feed according to the present invention.
Figure 9A:
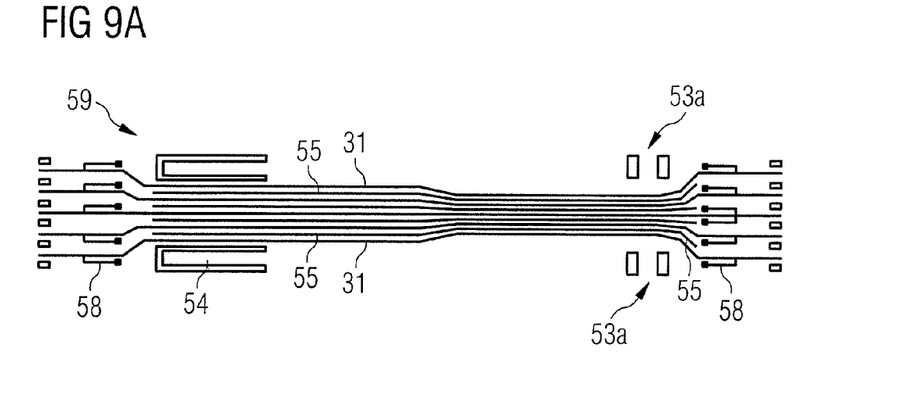
FIGS. 9A and 9B illustrates an antenna feed according to the present invention, showing the top and bottom layers respectively.
Figure 9B:
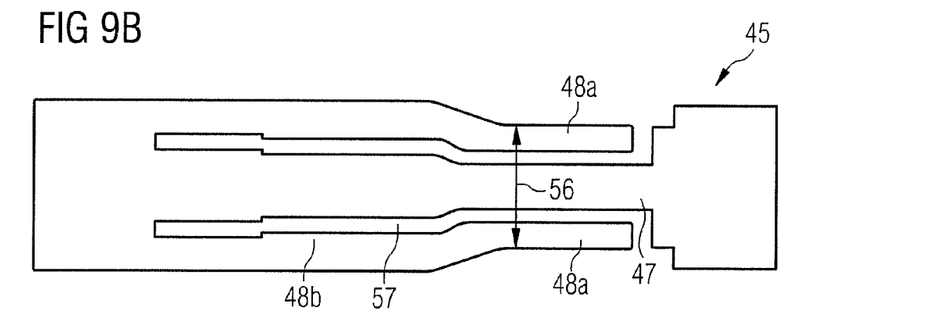

A plan view of an example of an antenna feed according to the present invention is shown in FIG. 8 and views of an embodiment as seem from above and below are shown in FIGS. 9A and 9B. The microwave feed lines are provided on one layer of substrate 46, typically a low loss microwave laminate. On another layer of the substrate an RF signal layer conductor 47 is applied, on each side of which and coplanar with the signal layer conductor are RF ground layers 48, or return conductors, the combination forming an RF trap 45. The ground and signal layers typically have a separation of more than 4 mm, in this example, the separation ranges from 5 mm to 6 mm. The microwave transmission lines for the microwave signals may be implemented as a structure such as microstrip or stripline (triplate). Alternatively, semi-rigid feed cable may be used for the microwave signals, or for feeding the MR Larmor frequency to the birdcage antenna. The signal layer 47 of the coplanar balun is used as the ground structure for the microwave transmission line 31. This is illustrated in more detail in FIGS. 9A and 9B. FIG. 9A illustrates a coplanar trap from above. Microstrip feed lines 31 are interleaved with guard rails 55. Capacitors can be mounted at position 53a and tuning sections 54 are also provided. At each end of the microstrip feed there may be quarter wavelength shunt lines 58.

Figure 10:
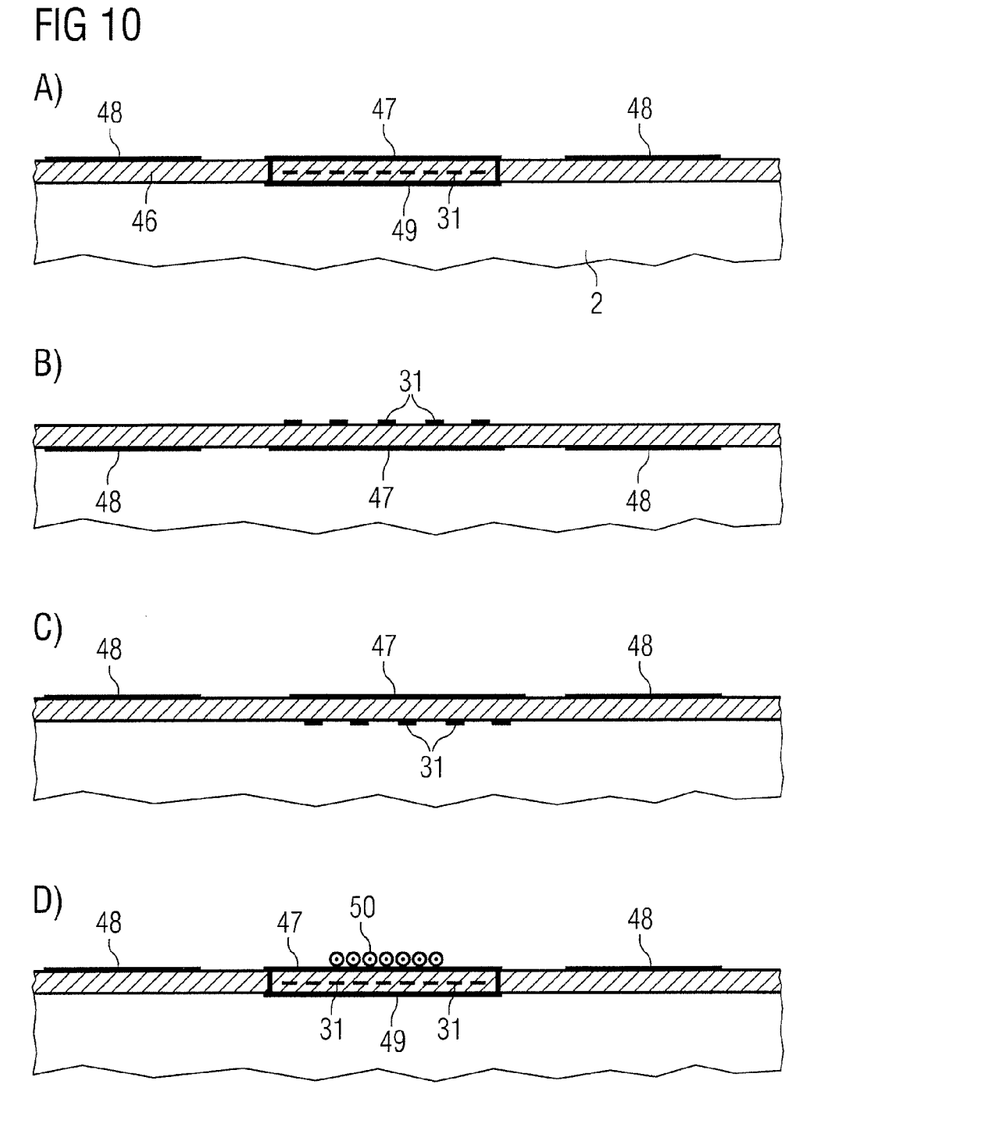
FIGS. 10A, 10B, 10C, 10D, 10E and 10F show cross sections of a number of example constructions for the antenna feed of the present invention.

The coplanar transmission line may be implemented on the top, bottom or both sides of a thin laminate wrapped around the bore tube. There are also several types and configurations of microwave transmission line 31. FIG. 10 details some possible combinations of coplanar transmission line and microwave transmission line mounted on the bore tube 2. FIG. 10A shows an example in which the co-planar trap 47, 48 is combined with a stripline microwave feed 49, with the microwave transmission lines 31 mounted with substrate and ground layers either side. The stripline ground layer on the same surface as the trap ground layers 48 is also the trap signal layer 47. The stripline structure is formed of three layers, ground-signal-ground and is a TEM transmission line rather than quasi-TEM as microstrip. In microstrip, some of the field fringes into the air and travels at one velocity and most of the signal travels through the dielectric with another velocity. This behavior of microstrip can lead to some issues, which are described later. In general, stripline is narrower than microstrip and is less effective at high signal powers.

There are considerable cost and fabrication advantages to keeping the thin laminate as a two layer structure. The low loss microwave laminate permits the microwave signals to be passed to and from the electronics with the minimum attenuation. FIG. 10B meets the above requirements and shows an example of a co-planar trap with the signal and ground layers 47, 48 formed on the bottom of the substrate 46 and the microwave transmission line 31 implemented as a microstrip microwave feed mounted in another plane of the substrate, in this case on the opposite face. In addition, ¼ wavelength lines 58 may be put at the input and output to force the microstrip lines to follow the same potential as the signal and ground on the other surface.

In FIG. 10C, the example of FIG. 10B is implemented the other way up, with the transmission line on the bottom surface of the substrate and the coplanar trap 47, 48 on the upper surface. FIG. 10D uses stripline in the same arrangement as FIG. 10A and additionally is provided with coaxial microwave feed lines 50 mounted on the signal layer 47 of the trap. FIG. 10E provides the coaxial microwave feed 50 on the signal layer 47 of the arrangement of FIG. 10C. Putting the semi-rigid cables for the microwave signals on the top layer reduces the overall size and can reduce the total number of traps required (and hence reduce the loading on the body coil).

FIG. 10F uses a stripline structure 49 of FIG. 10A for the signal layer 47 and microwave feed lines 31. The coplanar ground layers 48 are replicated on the lower layer of the microwave substrate and both grounds are clamped together to provide a continuity of ground. In this structure the transmission lines are disposed between the two substrates.

Analyzing the coplanar trap in more detail yields some implementation issues. The coplanar trap forms a high Q resonator, so its characteristics, in particular the losses must be carefully controlled. In order to optimize the performance of the coplanar trap, the coplanar transmission line between the short circuit and 59 and the capacitors 53 should have a high impedance and the transmission line losses should be minimized. These conditions may be met by using a medium width coplanar signal conductor 47, wide ground lands 48 and wide slots, 57.

Another requirement of the implementation is that the width available is reduced near to the capacitively loaded end, forming a neck 56. This finite width is due to the width of the end ring of the body coil and the presence of microwave antenna elements 12. Due to the finite width available for the coplanar transmission line, the center conductor 47 of the coplanar structure has a limited width. The consequence of this limitation in coplanar conductor width is that the microwave transmission lines 31 are moved closer together in this region, reducing the track spacing correspondingly if the number of lines is fixed, since the center conductor 47 acts as the ground plane for the microwave transmission lines 31. Moving the microwave transmission lines closer together increases the coupling between the lines (for a constant thickness of the laminate). The insertion loss for a microstrip line surrounded by other parallel microstrip lines can become significant as they are moved closer together. Some of the loss is due to the backward-wave coupling that occurs between parallel coupled lines, and some loss due to the forward-wave coupling as explained below.

A pair of coupled transmission lines can support two modes of propagation (odd and even modes). These modes have different characteristic impedances, but the velocity of propagation of the two modes is the same if the transmission line is surrounded by a homogenous structure, such as stripline. However, microstrip is not homogeneous and some of the field fringes into the air. This causes the different propagation modes to have different propagation velocities. This effect severely degrades the directivity of microstrip couplers. The directivity of a coupler (a pair of coupled microstrip lines) is a measure of the ratio of the forward-wave coupling to the backward-wave coupling. Microstrip couplers have poor directivity and even when lines are spaced a distance where the backward-wave coupling is not significant, the foward-wave coupling may be significant and cause an increase in insertion loss.

Figure 11:
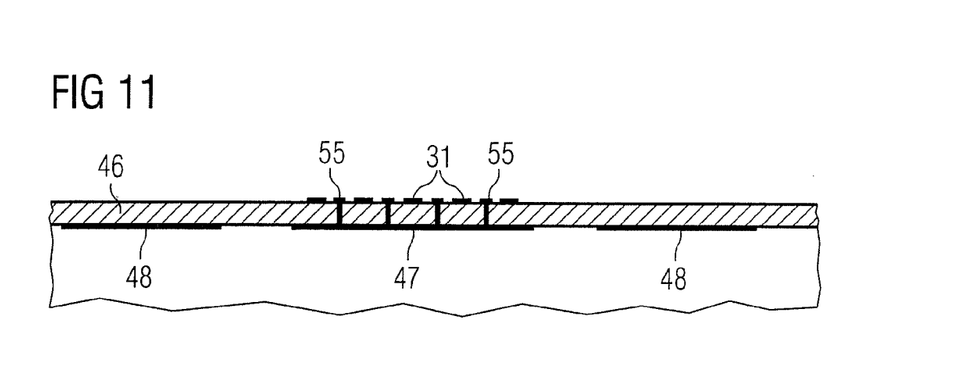
FIG. 11 shows a cross section through an antenna feed according to the present invention, provided with grounded guard rails.

However, the coupling and insertion loss may be reduced to an acceptable level by the introduction of grounded guard rails 55 between the signal conductors, as shown in the cross section FIG. 11. In this example, the coplanar trap 47, 48 is formed on the bottom surface of the substrate and guard rails 55 between the transmission lines 31, are connected to ground on the trap signal layer 47.

It can be seen from the plan view of FIGS. 9A and 9B that in addition to the microwave tracks 31, the upper layer of the board has high voltage capacitors 53 and the tuning sections 54. The tuning sections 54 allow the position of the short circuit on the coplanar transmission line 31 to be adjusted to account for the difference in the dielectric of the bore tube 2 that the microwave laminate 46 is wrapped around. The capacitors and tuning sections are fitted to the top microstrip layer of the printed circuit board to permit easy access and tuning since the bottom side of the trap is fitted against the boretube. FIG. 9B also shows that in the wide section of the coplanar track, not only does the RF signal track 31 increase in width, but also the slot 57 increases in width and the RF ground layers 48 increase. The increase in slot width 57 ensures that the coplanar transmission line 47, 48 has constant impedance and the increase in RF ground layer width 48$b$ as compared with ground layer at 48$a$, is required to ensure no degradation in attenuation of the coplanar transmission line.

Although modifications and changes may be suggested by those skilled in the art, it is the intention of the inventors to embody within the patent warranted hereon all changes and modifications as reasonably and properly come within the scope of their contribution to the art.

We claim as our invention:

1. A microwave antenna feed comprising:
a substrate;
a plurality of microwave transmission lines embodied in or on said substrate; and
at least one of said microwave transmission lines comprising a radio frequency trap electrically connected therein comprising a ground layer and a signal layer that are co-planarly mounted on one common surface of said substrate, said co-planar ground layer and signal layer being configured on said one surface of said substrate to block transmission of radio-frequency signals at a selected frequency.

2. An antenna feed according to claim 1, wherein the ground layer and signal layer are mounted on one face of the substrate and the microwave transmission lines are mounted in another plane of the substrate.

3. An antenna feed according to claim 1, wherein the ground layer and signal layer are positioned adjacent one another on the planar substrate, separated by a distance of greater than 4 mm.

4. An antenna feed according to claim 1, wherein the antenna feed further comprises a second substrate.

5. An antenna feed according to claim 4, wherein the transmission lines are disposed between the substrate and the second substrate.

6. An antenna feed according to claim 1, wherein a plurality of transmission lines mounted on the substrate are separated by ground rails.

7. An antenna feed according to claim 1, further comprising a plurality of semi-rigid feed cables mounted on the signal layer.

8. An antenna feed according to claim 1, wherein the feed further comprises a tuning section.

9. An antenna feed according to claim 1, wherein the feed further comprises capacitive loading.

10. An antenna feed according to claim 1, wherein the microwave transmission line comprises microstrip.

11. An antenna feed according to claim 1, wherein the microwave transmission line comprises stripline.

12. A magnetic resonance imaging assembly comprising;
- a scanner having a bore tube;
- an RF antenna comprising a plurality of antenna rungs mounted around the circumference of the bore tube;
- a plurality of microwave antenna elements mounted around the circumference of the bore tube;
- the antenna rungs and antenna elements being sub-divided into groups around the bore tube; and
- each of said groups comprising a microwave antenna feed comprising a substrate, a plurality of microwave transmission lines embodied in or on said substrate, and at least one of said microwave transmission lines comprising a radio frequency trap therein comprising a ground layer and a signal layer that are co-planarly mounted on one common surface of said substrate, said co-planar ground layer and signal layer being configured on said one surface of said substrate to block transmission of radio-frequency signals at a selected frequency.

13. An assembly according to claim 12, wherein the microwave antenna elements are interleaved with the antenna rungs within the groups.

* * * * *